(12) United States Patent
Shida

(10) Patent No.: US 6,362,641 B2
(45) Date of Patent: *Mar. 26, 2002

(54) INTEGRATED CIRCUIT DEVICE AND SEMICONDUCTOR WAFER HAVING TEST CIRCUIT THEREIN

(75) Inventor: Akira Shida, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/379,078

(22) Filed: Aug. 23, 1999

(30) Foreign Application Priority Data

Aug. 25, 1998 (JP) .......................................... 10-238867

(51) Int. Cl.⁷ ............................................... G01R 31/26
(52) U.S. Cl. ......................... 324/765; 257/48; 257/401
(58) Field of Search ............................... 324/766, 550, 324/713, 537, 525, 763, 765, 733; 257/751, 750, 752, 755, 758, 48, 401, 411; 438/624, 622, 631

(56) References Cited

U.S. PATENT DOCUMENTS 5,485,095 A * 1/1996 Bertsch et al. ............... 324/537
6,104,056 A * 8/2000 Yano et al. ................... 257/314

FOREIGN PATENT DOCUMENTS

| JP | 62-229952 | 10/1987 |
| JP | 62-274635 | 11/1987 |
| JP | 63-250119 | 10/1988 |
| JP | 3-262145 | 11/1991 |
| JP | 4-134841 | 5/1992 |
| JP | 5-55322 | 3/1993 |
| JP | 5-172896 | 7/1993 |
| JP | 09-107011 | 4/1997 |
| JP | 10-189678 | 7/1998 |

* cited by examiner

*Primary Examiner*—Safet Metjahic
*Assistant Examiner*—Etienne LeRoux
(74) *Attorney, Agent, or Firm*—Hutchins, Wheeler & Dittmar

(57) ABSTRACT

An integrated circuit device capable of testing manufacturing errors such as variations in dimensions at a masking step or the like or misalignment at an alignment step in a plurality of directions with a test circuit having a monitor transistor. The integrated circuit device has a functional circuit for performing a function assigned to the integrated circuit device and a test circuit. The test circuit comprises a plurality of MIS (Metal-Insulator-Semiconductor) transistors each having a gate electrode projecting from a gap between a source region and a drain region, respective gate electrodes projecting in directions different from one another. Typically, the integrated circuit device has a rectangular shape in which the test circuit is disposed inside of each vertex thereof. The test circuit is typically formed from four MOS (Metal-Oxide-Semiconductor) transistors having gate electrodes projecting in directions different from one another by approximately 90 degrees.

12 Claims, 4 Drawing Sheets

INTEGRATED CIRCUIT DEVICE AND SEMICONDUCTOR WAFER HAVING TEST CIRCUIT THEREIN

BACKGROUND OF THE INVENTION

1. Field of the Invention

The present invention relates to an integrated circuit device having a test circuit as well as a functional circuit on a surface of a circuit substrate such as a silicon semiconductor substrate with a thin film formation technology, and to a semiconductor wafer having a plurality of integrated circuit devices partitioned through scribing areas.

2. Description of the Prior Art

Integrated circuit devices such as ICs (Integrate Circuit) and LSIs (Large Scale Integration) are used in various types of electronic equipment. Such a integrated circuit device typically comprises a single rectangular circuit substrate, on which surface a functional circuit is formed with a thin-film formation technology for implementing various functions to be performed by the integrated circuit. As a circuit substrate, a silicon semiconductor substrate, a GaAs semiconductor substrate or the like is generally used.

When an integrated circuit device configured as described above is fabricated, typically, a silicon wafer is provided as a single large substrate and a surface thereof is sectioned into a plurality of circuit substrates through a scribing area. The plurality of circuit substrates are formed for respective integrated circuit devices to be mass-produced at a time from a single silicon wafer, while the scribing area is formed as a cutting margin for dividing the silicon wafer into respective circuit substrates.

The sectioning into circuit substrates is actually performed simultaneously with the formation of circuits with exposure utilizing a mask. The formation of functional circuits of the same pattern in a plurality of circuit substrates results in the same integrated circuit devices mass-produced from a single silicon wafer.

However, when functional circuits are formed with a thin-film formation technology such as the aforementioned exposure, defects in manufacture may occur in integrated circuit devices due to various types of manufacturing errors. Specifically, semiconductor circuits are typically formed by stacking layer films of various shapes, in which case defects may occur due to various types of errors.

Factors of such defects include variations in various dimensions, variations in misalignment at an alignment step, or the like. For example, in the case of an MIS (Metal-Insulator-Semiconductor) transistor, since a gate length of a transistor determines performance and reliability of a functional circuit, variations in the gate length in manufacturing steps causes reduced yields including performance and reliability. Additionally, if alignment accuracy is not ensured at various alignment steps, a leakage current flows or a short-circuit occurs in portions which should be electrically insulated, which may cause defects.

It is necessary to determine a completed integrated circuit device is satisfactory or not. However, since an enormous number of functional elements are integrated in a functional circuit at a high density, it is difficult to individually test the functional elements for determining whether each of them is satisfactory or not. For this reason, a measure is taken that a monitor transistor is formed simultaneously with a functional circuit at the manufacture of an integrated circuit device for testing the presence or absence of manufacturing errors by the monitor transistor.

A technology for forming a monitor transistor together with a functional circuit is disclosed, for example, in JP-A-62-229952, JP-A-63-250119, JP-A-03-262145, JP-A-05-055322, JP-A-05-172896, or the like.

Among them, JP-A-62-229952 and JP-A-63-250119 disclose that a monitor transistor is formed in a scribing area of a silicon wafer to allow the test of manufacturing errors without preventing the scale of integration of an integrated circuit device.

In integrated circuit devices disclosed in JP-A-03-262145 and JP-A-05-055322, monitor transistors are formed in respective four corners of a rectangular circuit substrate. This enables the test of manufacturing errors in substantially the whole area of a circuit substrate.

In an integrated circuit device disclosed in JP-A-05-172896, a p-channel MOS (Metal Oxide Semiconductor) transistor and an n-channel MOS transistor are formed as monitor transistors on a single circuit substrate. This enables the test of characteristics of both a p-channel MOS transistor and n-channel MOS transistor.

Presently, design rules for integrated circuit devices are increasingly detailed, and it becomes very difficult to improve various dimensional accuracy and alignment accuracy at an alignment step.

Integrated circuit devices such as CMOS (Complementary MOS) circuits after 0.15 $\mu$m generation exhibit extremely reduced yields and reliability if the dimensional accuracy and alignment accuracy can not be ensured. For example, when a gate length is reduced in dimension below a defined value, or when a displacement of a gate electrode with respect to a diffusion layer formed at the previous step causes a reduction in a projecting length of the gate electrode into the diffusion layer, a leakage current above an allowable value flows between a source and drain of a transistor, rendering the transistor defective.

On the other hand, in recent years, a chip size per integrate circuit device tends to be increased due to higher performance of integrated circuit devices. Additionally, multi-image products are increased in number for the purpose of improving productivity and reducing manufacturing time. For this reason, it is necessary to make the most of an effective exposure area of an exposure system, although it is generally known that dimensional accuracy and alignment accuracy are reduced in outer regions of an exposure shot.

The causes of the reduced dimensional accuracy and alignment accuracy in outer regions of an exposure shot include distortion of a projection lens, errors in movement of a scanning stage, errors in detection or arrangement of pattern alignment, errors in detection of reticle alignment, or changes over time of movable sections or a detection system. These causes are complicatedly combined to increase manufacturing errors in outer regions of an exposure shot.

In this manner, the detailed design rule and the increased effective exposure area contribute to an increased number of defects caused by manufacturing errors at an exposure step. As described above, various errors caused by exposure are significantly found in outer regions of an exposure shot. Monitor transistors disposed in those regions for suppressing manufacturing errors lead to improvement in yields as well as improvement in reliability of integrated circuit devices.

The referenced prior art technologies enable the test of manufacturing errors without preventing the scale of integration of integrated circuit devices, the test of manufacturing errors in substantially the whole area of a circuit substrate, the test of characteristics of both a p-channel MOS transistor and n-channel MOS transistor, or the like.

However, all of the aforementioned prior art technologies can test manufacturing errors only in one direction and can not test defects in a two-dimensionally formed integrated circuit device favorably. For example, let it be assumed that an MIS transistor formed on a circuit substrate as a functional circuit has a gate electrode oriented in an x-direction and its insufficient gate length causes an abnormal current to flow between a source and drain. In this case, if a gate electrode of a monitor transistor is oriented in a y-direction, the abnormality can not be detected even with monitor transistors disposed at four corners of the circuit substrate, rendering the integrate circuit device defective.

Additionally, in an integrated circuit device in which monitor transistors having their gate electrodes projecting in the positive y-direction with respect to a diffusion layer are disposed at four corners of a circuit substrate, the monitor transistors can not detect an abnormality that occurs when a gate electrode of an MIS transistor formed as a functional circuit on the circuit substrate is displaced in a negative y-direction to cause an abnormal current to flow between a source and drain.

In this manner, since a prior art monitor transistor has a gate electrode projecting in one direction from a gap between a source region and drain region, it is impossible to detect all of manufacturing errors in various directions caused by exposure. In a typical integrated circuit device, since a functional circuit is two-dimensionally formed with a configuration corresponding to four directions of ±x-directions and ±y-directions, the test of manufacturing errors only in one direction as described above does not provide a reliable test of defects in a integrated circuit device.

SUMMARY OF THE INVENTION

An object of the present invention to provide an integrated circuit device capable of testing manufacturing errors in a plurality of directions.

Another object of the present invention to provide a semiconductor wafer capable of testing manufacturing errors of a integrated circuit device in a plurality of directions.

The first object of the present invention is achieved by an integrated circuit device comprising a functional circuit, and a test circuit including a plurality of MIS transistors each having a gate electrode projecting from a gap between a source region and a drain region, respective gate electrodes projecting in directions different from one another.

In the integrated circuit device, various functions assigned to the integrated circuit can be exerted with the functional circuit. Since the plurality of MIS transistors forming the test circuit each having a gate electrode projecting from a gap between a source region and a drain region, respective gate electrodes projecting in directions different from one another, manufacturing errors in the functional circuit can be tested with the plurality of MIS transistors in a plurality of directions to favorably detect a defective integrated circuit device.

In an embodiment of the integrated circuit device according to the present invention, the test circuit includes a pair of MIS transistors, the pair of MIS transistors has the gate electrodes projecting in directions opposite to each other, and a pair of the gate electrodes is formed from opposite end portions of an electrode layer in the same axial direction. This allows the test of manufacturing errors in the functional circuit in a pair of opposite directions. At this time, since the gate electrodes of the pair of MIS transistors are formed from the end portions of a single electrode layer, the pair of MIS transistor forming the test circuit has a simple configuration.

The shape of the integrated circuit device is a predetermined polygon for example, and typically a rectangle. In this case, the test circuit may be disposed at an inner position of a vertex of the polygon. Since the disposition of the test circuit in this manner means that the test circuit is located in the outer region of the integrated circuit device, manufacturing errors in the functional circuit can be tested in substantially the whole area of the integrated circuit device.

The second object of the present invention is achieved by a semiconductor wafer comprising a plurality of integrated circuit devices each including a functional circuit, a scribing area for separating the plurality of integrated circuit devices, and a test circuit, located in the scribing area, including a plurality of MIS transistors each having a gate electrode projecting from a gap between a source region and a drain region, respective gate electrodes projecting in directions different from one another.

The semiconductor wafer according to the present invention is cut off with the scribing area to result in a number of integrated circuit devices mass-produced at a time. The integrated circuit device thus manufactured can generate various functions with functional circuit. Since the test circuit is formed in the scribing area of the semiconductor wafer and the plurality of MIS transistors forming the test circuit each having a gate electrode projecting from a gap between a source region and a drain region, respective gate electrodes projecting in directions different from one another, manufacturing errors in the functional circuit of the integrated circuit device can be tested with the plurality of MIS transistors in a plurality of directions. The test circuit for testing the functional circuit of the integrated circuit device thus formed in the scribing area of the semiconductor wafer causes no reduction in scale of integration of the integrated circuit device due to the formation of the test circuit. Since manufacturing errors in the functional circuit can be tested with the plurality of MIS transistors in a plurality of directions, it is possible to satisfactorily detect defective integrated circuit devices mass-produced from the semiconductor wafer. The test circuit for testing the functional circuit of the integrated circuit device is formed in the scribing area of the semiconductor wafer, thereby providing a favorable scale of integration of the integrated circuit device.

The above and other objects, features, and advantages of the present invention will become apparent from the following description referring to the accompanying drawings which illustrate examples of preferred embodiments of the present invention.

DESCRIPTION OF THE PREFERRED EMBODIMENTS

The following description will be made assuming that four directions of up, down, right and left directions in the accompanying drawings are used as four directions of forward, backward, right and left in an integrated circuit device of preferred embodiments of the present invention. However, the directions are defined for convenience to simplify the description, and it is not intended that directions are limited when an integrated circuit device is actually manufactured or used.

Figure 1:
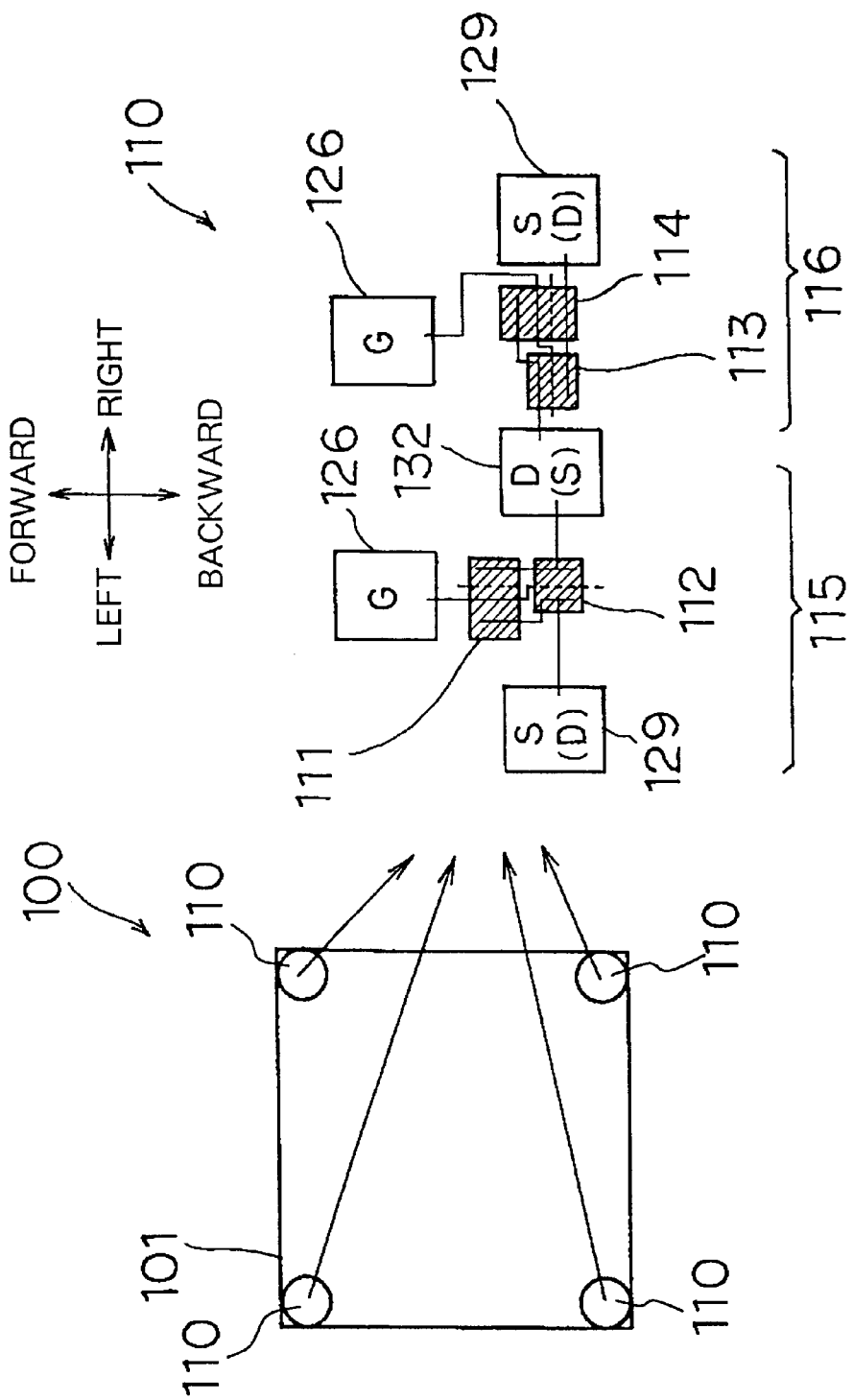
FIG. 1 is a schematic diagram showing a configuration of an integrated circuit device of a preferred embodiment of the present invention.

An integrated circuit device shown in FIG. 1 is fabricated from a silicon wafer serving as a single large substrate with a thin-film formation technology which utilizes a circuit manufacturing system comprising a stepping projection aligner. The projection aligner at least comprises a light source for emitting a light beam for exposure, a reticle for masking the light beam emitted from the light source in an exposure pattern, a scanning stage for horizontally holding a silicon wafer to move it in forward, backward, right and left directions, a focusing optical system for focusing the light beam for exposure masked by the reticle onto a surface of the silicon wafer held by the scanning stage, a reticle replacing mechanism for replacing various reticles. The circuit manufacturing system provides a function for partitioning a silicon wafer into sections for each integrated circuit device, a function for forming a circuit for each integrated circuit device, a function for forming a test circuit, or the like with the aforementioned configuration.

With the use of such a circuit manufacturing system, a plurality of integrated circuit devices 100 are fabricated from a single silicon wafer. Specifically, a plurality of replaceable reticles are formed to section a large circular silicon wafer into a plurality of circuit substrates 101 of the same rectangular shape such that the same functional circuit and test circuit 110 are individually exposed in each of circuit substrates 101 thus sectioned.

The circuit manufacturing system holds a silicon wafer at each predetermined position and moves it with the scanning stage, and sequentially and partially exposes it with the light source, the reticle and the focusing optical system, thereby sectioning a single silicon wafer into a plurality of rectangular circuit substrates 101. In other words, partitioning into sections is performed.

Simultaneously, the circuit manufacturing system forms various functional circuits in respective circuit substrates 101 thus sectioned with a thin-film formation technology similar to the prior art using its function for forming a circuit. Additionally, shown in FIG. 1, the circuit manufacturing system forms test circuits 110 at inner positions of respective four corners of circuit substrate 101.

Each test circuit 110 thus formed herein comprises four MOS transistors 111 to 114 which are configured to correspond to respective four test directions of forward, backward, right and left. More specifically, first and second MOS transistors 111 and 112 form forward and backward test section 115 for testing manufacturing errors in forward and backward directions, while third and fourth MOS transistors 113 and 114 form right and left test section 116 for testing manufacturing errors in right and left directions.

Forward and backward test section 115 and right and left test section 116 are formed to have the same configuration as each other but orientations of the respective sections are orthogonal to each other. Specifically, all of four MOS transistors 111 to 114 has source region 121 and drain region 122 in which gate electrode 123 (FIG. 2) projects from a gap between source region 121 and drain region 122 such that the projecting direction of gate electrode 123 varies from one MOS transistor to another. In first MOS transistor 111, gate electrode 123 projects in a forward direction; in second MOS transistor 112, in backward direction; in third MOS transistor 113, in left direction; and in fourth MOS transistor 114, in right direction.

Figure 2:
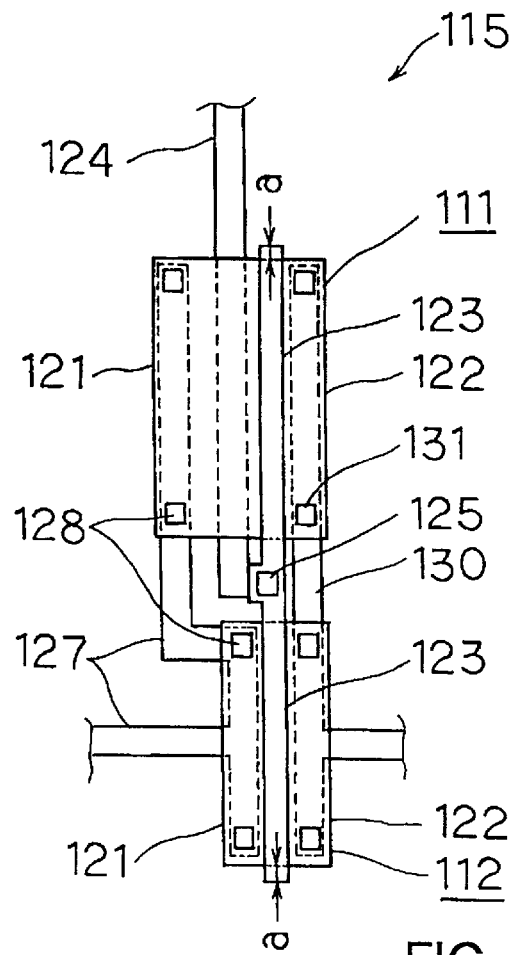
FIG. 2 is a plan view showing main portions of a test circuit.

Forward and backward test section 115, as shown in FIG. 2, has a pair of MOS transistors 111 and 112 with their gate electrodes 123 which comprise opposite end portions of an electrode layer in the same axial direction such that projecting directions thereof are opposite to each other as the forward and backward directions. A pair of integrated gate electrodes 123 of MOS transistors 111 and 112 is connected at contact portion 125 to single gate wire 124 which is connected to single gate terminal 126. Additionally, a pair of source regions 121 of MOS transistors 111 and 112 is connected at contact portions 128 to single source wire 127 which is connected to single source terminal 129. Similarly, a pair of drain regions 122 of MOS transistors 111 and 112 is connected at contact portions 131 to single drain wire 130 which is connected to single drain terminal 132. As shown in FIG. 1, drain terminal 132 is shared in this case between forward and backward test section 115 and right and left test section 116.

Right and left test section 116 has a configuration formed by rotating 90 degrees the configuration of forward and backward test section 115 in circuit substrate 100.

In the integrated circuit device, various functional circuits are configured such that straight line directions of respective circuit portions are orthogonal to each other and the orthogonal straight line directions of respective portions of a functional circuit are parallel to the aforementioned forward and backward directions and left and right directions. Therefore, the projecting directions of gate electrodes 123 of four MOS transistors 111 to 114 in test circuit 110 correspond to forward, backward, right and left which are directions of both ends of respective paired orthogonal straight line directions of the functional circuit.

Each portion of a functional circuit is formed with a predetermined length as a minimum unit according to the design rule therefor. Accordingly, MOS transistors 111 to 114 of test circuit 110 are formed such that various dimensions such as projecting length a of gate electrode 123, a width of gate electrode 123 orthogonal to the projecting direction thereof, or respective gaps between the peripheries of contacts 125, 128 and 131 and edges of wires 124, 127 and 130 are equal to or shorter than the minimum unit of length in the functional circuit.

Integrated circuit device 100, as describe above, is formed using a circuit manufacturing system by sectioning a single large circular silicon wafer into a plurality of the same rectangular circuit substrates 101 and simultaneously exposing the same functional circuits and test circuits 110 on respective circuit substrates 101 thus sectioned, with a procedure basically similar to that of the prior art. In this manner, since test circuit 110 is formed simultaneously with a functional circuit, manufacturing errors occurring in the functional circuit similarly occur in test circuit 110. As a result, when any of gate electrodes 123 of MOS transistors 111 to 114 in test circuit 110 is formed with a displacement in a direction opposite to the projecting direction corresponding to manufacturing errors in a functional circuit, the associated one of MOS transistors 111 to 114 develops a short-circuit in source region 121 and drain region 122. In other words, the test of electrical characteristics of MOS transistors 111 to 114 allows the generation of manufacturing errors to be identified.

Additionally, when gate electrode 123 of MOS transistors 111 to 114 in one of test sections 115 and 116 is formed to be narrowed corresponding to manufacturing errors in a functional circuit, abnormality occurs in electrical characteristics, for example, a reduction in threshold voltage $V_t$. The detection of the abnormality also allows the generation of manufacturing errors to be identified.

In integrated circuit device 100, each test circuit 110 comprises four MOS transistors 111 to 114 which have gate electrodes 123 projecting in four directions of forward, backward, right and left, respectively. This enables integrated circuit device 100 to test manufacturing errors in a functional circuit in four directions of forward, backward, right and left directions and to reliably test manufacturing errors occurring in various circuit portions in various directions. In particular, when each portion of the functional circuit is formed to be parallel to any of four directions of forward, backward, right and left, the four directions are respectively tested by test circuit 110, thereby making it possible to favorably test manufacturing errors possibly occurring in each portion of the functional circuit. Furthermore, since each of paired transistors of four MOS transistors 111 to 114 with opposite test directions has gate electrode 123 comprising opposite end portions of an electrode layer in the same axial direction, a test for opposite directions can be reliably performed, and the structure thereof is simple and productivity is satisfactory.

Additionally, since integrated circuit device 100 is typically formed to be rectangular in which test circuits 110 are formed at inner positions of respective four corners thereof, the test of manufacturing errors in four directions is performed in substantially the whole area of circuit substrate 101, resulting in the whole integrated functional circuits being favorably tested. Each of MOS transistors 111 to 114 in test circuit 110 has gate electrode 123 projecting over a length equal to or shorter than the minimum unit in the design rule in the functional circuit, thereby making it possible to test a manufacturing error identical to the minimum unit of the functional circuit if the direction in which the manufacturing error occurs is aligned with the projecting direction of gate electrode 123.

Although a preferred embodiment of the present invention has been described above, the present invention is not limited to the above aspect but permits various modifications without departing its scope. For example, although the above aspect illustrates integrated circuit device 100 formed in a general rectangle, integrated circuit device 100 may be formed as a polygon such as a hexagon in which test circuit 110 may be disposed in each of a plurality of corner portions.

Additionally, the above aspect illustrates that respective portions of a functional circuit are parallel to forward, backward, right and left directions and that test circuit 110 is formed from four MOS transistors 111 to 114 having gate electrodes 123 projecting in forward, backward, right and left directions. However, when manufacturing errors only in forward and backward directions are of interest because of a structure of a functional circuit or the like, a test circuit may be formed from a pair of MOS transistors having gate electrodes projecting in forward and backward directions. When manufacturing errors only in forward and left directions are of interest, a test circuit may be formed from a pair of MOS transistors having gate electrodes projecting in backward and right directions.

Figures 3A, 3B:
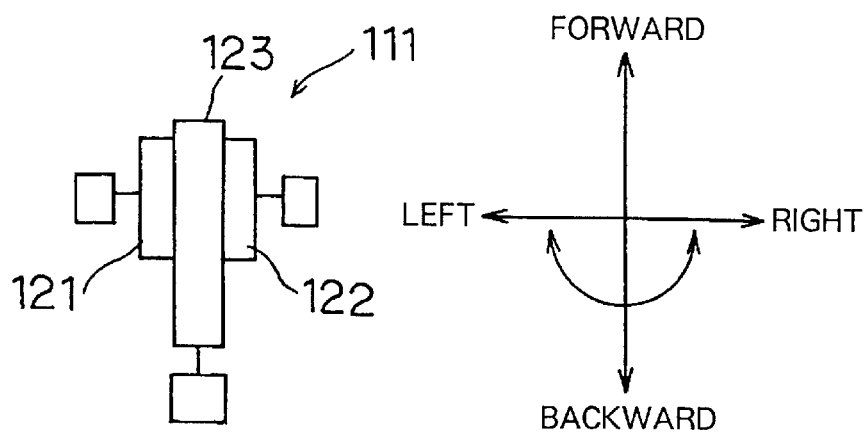
FIG. 3A is a schematic diagram showing a shape of an MOS (Metal-Oxide-Semiconductor) transistor which is an MIS transistor.
FIG. 3B is a schematic diagram showing a relationship between the shape of the MOS transistor shown in FIG. 3A and a test range for manufacturing errors.
Figure 4:
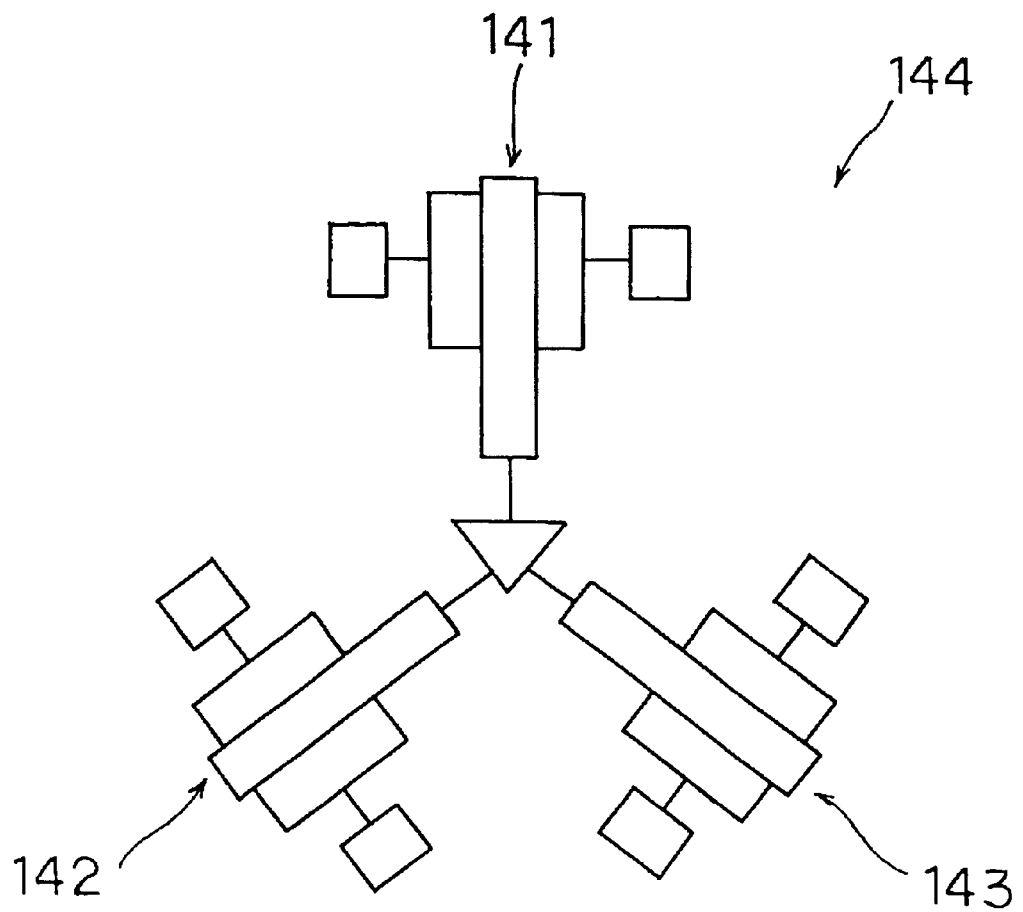
FIG. 4 is a plan view showing a test circuit of an alternative embodiment.

MOS transistor 111 having gate electrode 123 projecting in a forward direction, as shown in FIG. 3A and 3B, can favorably test manufacturing errors in a backward direction as well as errors in a left back direction and right back direction. However, the sensitivity of test is reduced as an angle is larger with respect to the backward direction, and left, right and forward directions can not be tested. In other words, a single MOS transistor has a test direction with a range within 180 degrees centered on a direction opposite to a projecting direction of its gate electrode. Therefore, as shown in FIG. 4 for example, if test circuit 144 is formed from three MOS transistors 141 to 143 having their gate electrodes projecting in directions which are different from one another by 120 degrees, manufacturing errors in all directions can be test with a minimum structure. Additionally, when the number of MOS transistors radially disposed is increased, test accuracy in each direction can be improved.

Figure 5A:
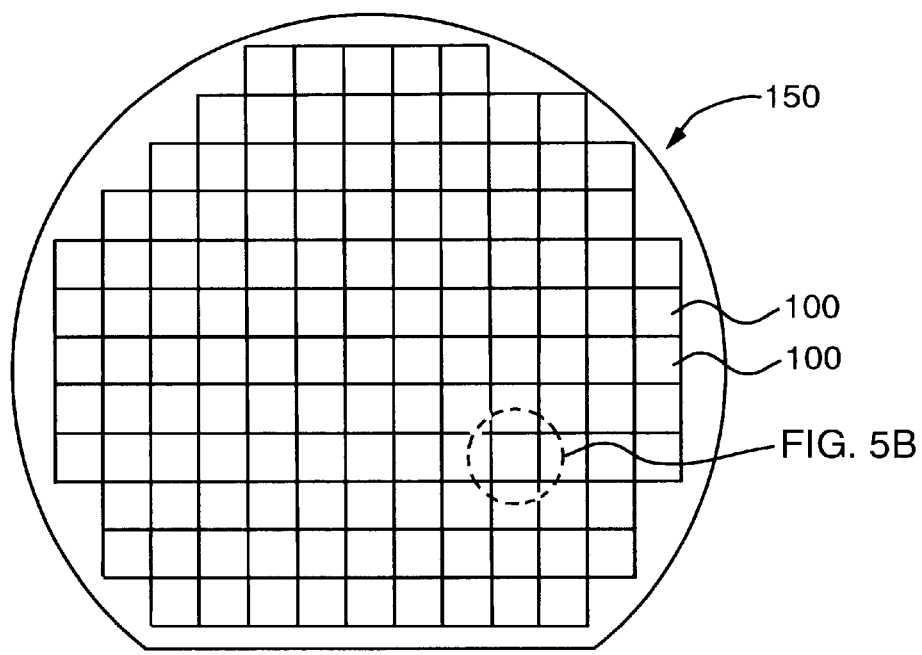
FIG. 5 is a plan view showing a semiconductor wafer having test circuits provided in scribing areas.
Figure 5B:
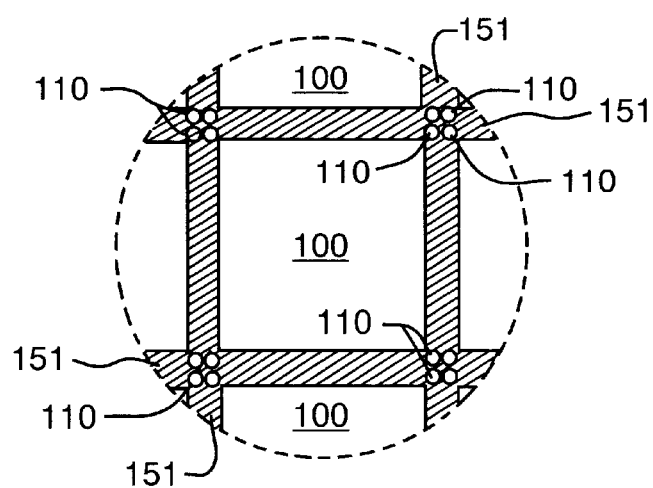

The position at which test circuit 110 is formed is not limited to the inside of circuit substrate 101 in integrated circuit device 100. For example, as shown in FIG. 5, the formation of the aforementioned test circuit 110 in scribing area 151 in silicon wafer 150 allows test in various directions to be performed without preventing the scale of integration of a functional circuit in integrated circuit device 100.

In the above embodiment, since a pair of MOS transistors 111 and 112 (113 and 114) of forward and backward (right and left) test section 115 (116) share various terminals 126, 129 and 132, manufacturing errors in forward and backward (right and left) directions can be test with a simple structure. However, it is not possible to determine whether a direction in which the manufacturing error occurs is forward or backward (right or left) direction. When it is of concern to determine in which direction manufacturing errors occur, a dedicated terminal may be provided in each of MOS transistors forming a test circuit.

It is to be understood that variations and modifications of the present invention disclosed herein will be evident to those skilled in the art. It is intended that all such modifications and variations be included within the scope of the appended claims.

What is claimed is:

1. An integrated circuit device comprising:
   a functional circuit; and
   a gate to active area alignment test circuit including a plurality of MIS (Metal-Insulator-Semiconductor) transistors each having a gate electrode with at least a first side having an electrical connection and a second side projecting for a selected distance from one of a plurality of sides of a gap between a source region and a drain region disposed upon an active area of each one of the plurality of transistors of the test circuit, respective gate electrodes of each of the plurality of transistors having second sides projecting in directions different from one another in each individual one of said plurality of transistors;
   wherein said functional circuit has respective portions formed with a predetermined length as a minimum unit in accordance with a design rule and the second side of the gate electrode projects for the selected distance over a length equal to or shorter than the minimum unit in said test circuit; and
   the test circuit further comprises a gate terminal connecting to the gate electrode;

a source terminal connecting to the source region;
a drain terminal connecting to the drain region; and
the test circuit tests electrical characteristics by measuring a short-circuit between the source region connected to the source terminal and the drain region connected to the drain terminal.

2. The integrated circuit device according to claim 1, wherein said test circuit includes a pair of MIS transistors, said pair of MIS transistors each have the second side of the gate electrodes which project for the selected distance, projecting in directions opposite to each other, and said gate electrodes comprise opposite end portions of a single electrode disposed to extend in one selected axial direction.

3. The integrated circuit device according to claim 1, wherein said test circuit includes a pair of MIS transistors and said pair of MIS transistors have the second side of the gate electrodes projecting for the selected distance in directions orthogonal to each other.

4. The integrated circuit device according to claim 1, wherein said test circuit includes four MIS transistors and said four MIS transistors have the second side of the gate electrodes projecting for the selected distance in directions different from one another with a spacing of approximately 90 degrees in projecting direction therebetween.

5. The integrated circuit device according to claim 1, wherein said integrated circuit device is configured as a selected polygon shape and said test circuit is disposed at a inner position of a vertex of the polygon.

6. The integrated circuit device according to claim 5, wherein the selected polygon shape is a rectangle.

7. A semiconductor wafer comprising:
a plurality of integrated circuit devices each including a functional circuit;
a scribing area for partitioning said plurality of integrated circuit devices; and
a test circuit, located in said scribing area, including a plurality of MIS transistors each having a gate electrode with at least a first side having an electrical connection and a second side projecting for a selected distance from one of a plurality of sides of a gap between a source region and a drain region thereof, respective gate electrodes having second sides projecting in directions different from one another in each individual one of said plurality of transistors;
wherein said functional circuit has respective portions formed with a predetermined length as a minimum unit in accordance with a design rule and the second side of the gate electrode projects for the selected distance over a length equal to or shorter than the minimum unit in said test circuit; and
the test circuit further comprises a gate terminal connecting to the gate electrode;
a source terminal connecting to the source region;
a drain terminal connecting to the drain region; and
the test circuit tests electrical characteristics by measuring a short-circuit between the source region connected to the source terminal and the drain region connected to the drain terminal.

8. The semiconductor wafer according to claim 7, wherein said test circuit includes a pair of MIS transistors, said pair of MIS transistors each have the second sides of the gate electrodes which project for the selected distance in directions opposite to each other, and said gate electrodes comprise opposite end portions of a single electrode disposed to extend in one selected axial direction.

9. The semiconductor wafer according to claim 7, wherein said test circuit includes a pair of MIS transistors and said pair of MIS transistors each have the second sides of the gate electrodes projecting for the selected distance in directions orthogonal to each other.

10. The semiconductor wafer device according to claim 7, wherein said test circuit includes four MIS transistors and said four MIS transistors each have the second sides of the gate electrodes projecting for the selected distance in directions different from one another with a spacing in the projecting direction of approximately 90 degrees therebetween.

11. A circuit test method comprising:
providing on a circuit substrate a functional circuit and a test circuit including a plurality of MIS (Metal-Insulator-Semiconductor) transistors each having a gate electrode with at least a first side having an electrical connection and a second side projecting for a selected distance from one of a plurality of sides of a gap between a source region and a drain region thereof, respective gate electrodes projecting in directions different from one another to form an integrated circuit device; and
inspecting said integrated circuit device by testing electrical characteristics of said plurality of MIS transistors of said test circuit;
wherein said functional circuit has respective portions formed with a predetermined length as a minimum unit in accordance with a design rule and the second side of the gate electrode projects for the selected distance over a length equal to or shorter than the minimum unit in said test circuit; and
the test circuit further comprises a gate terminal connecting to the gate electrode;
a source terminal connecting to the source region;
a drain terminal connecting to the drain region; and
the test circuit tests electrical characteristics by measuring a short-circuit between the source region connected to the source terminal and the drain region connected to the drain terminal.

12. A circuit test method comprising:
providing on a semiconductor wafer a plurality integrated circuit devices each including a functional circuit, a scribing area for partitioning said integrated circuit devices, and a test circuit, located in said scribing area, including a plurality of MIS transistors each having a gate electrode with at least a first side having an electrical connection and a second side projecting for a selected distance from one of a plurality of sides of a gap between a source region and a drain region thereof, respective gate electrodes projecting in directions different from one another; and
inspecting said semiconductor wafer by testing electrical characteristics of said plurality of MIS transistors of said test circuit;
wherein said functional circuit has respective portions formed with a predetermined length as a minimum unit in accordance with a design rule and the second side of the gate electrode projects for the selected distance over a length equal to or shorter than the minimum unit in said test circuit; and
the test circuit further comprises a gate terminal connecting to the gate electrode;
a source terminal connecting to the source region;
a drain terminal connecting to the drain region; and
the test circuit tests electrical characteristics by measuring a short-circuit between the source region connected to the source terminal and the drain region connected to the drain terminal.

* * * * *